(12) United States Patent
Cui

(10) Patent No.: US 7,868,347 B2
(45) Date of Patent: Jan. 11, 2011

(54) METAL CORE MULTI-LED SMD PACKAGE AND METHOD OF PRODUCING THE SAME

(75) Inventor: Lijun Cui, Arlington, MA (US)

(73) Assignee: Sky Advanced LED Technologies Inc, Arlington, MA (US)

(*) Notice: Subject to any disclaimer, the term of this patent is extended or adjusted under 35 U.S.C. 154(b) by 0 days.

(21) Appl. No.: 12/404,309

(22) Filed: Mar. 15, 2009

(65) Prior Publication Data

US 2010/0230689 A1 Sep. 16, 2010

(51) Int. Cl.
*H01L 33/62* (2010.01)
(52) U.S. Cl. .................................. 257/99; 257/E33.075
(58) Field of Classification Search ............. 257/88–93, 257/99–100, 433, E33.075
See application file for complete search history.

(56) References Cited

U.S. PATENT DOCUMENTS

| | | | | |
|---|---|---|---|---|
| 6,936,855 | B1* | 8/2005 | Harrah | 257/88 |
| 6,970,612 | B2* | 11/2005 | Ouchi | 385/14 |
| 7,511,311 | B2* | 3/2009 | Kususe et al. | 257/95 |
| 7,612,385 | B2* | 11/2009 | Kim et al. | 257/99 |
| 2008/0179618 | A1* | 7/2008 | Cheng | 257/99 |
| 2008/0290354 | A1* | 11/2008 | Hoelen et al. | 257/90 |
| 2008/0303157 | A1* | 12/2008 | Cheng et al. | 257/758 |
| 2009/0072250 | A1* | 3/2009 | Inoue | 257/88 |
| 2009/0140271 | A1* | 6/2009 | Sah | 257/88 |
| 2009/0159902 | A1* | 6/2009 | Yasuda et al. | 257/88 |
| 2009/0272991 | A1* | 11/2009 | Lee et al. | 257/91 |
| 2010/0038669 | A1* | 2/2010 | McKenzie | 257/98 |
| 2010/0046201 | A1* | 2/2010 | Wang et al. | 362/97.1 |

* cited by examiner

Primary Examiner—Nathan W Ha

(57) ABSTRACT

A new SMD (surface mount devices) package design for efficiently removing heat from LED Chip(s) is involved in this invention. Different from the regular SMD package, which electrical isolated materials like Alumina or AlN are used, the substrate material here is metal like Copper, Aluminum and so on. Also, different from regular design, which most time only has one LED chip inside, current design will at least have two or more LED chips (or chip groups) in one package. All chips are electrical connected via metal blocks, traces or wire-bond. This type of structure is generally fabricated via chemical etching and then filled with dielectric material inside to form a strong package. Because the thermal conductivity of the metal is much higher than the ceramics, the package thermal resistance is much lower than the ceramics based package. Also, the cost of the package is much lower than ceramics package. Moreover, emitting area in one package is much larger than the current arts.

6 Claims, 5 Drawing Sheets

(multi-die group version)

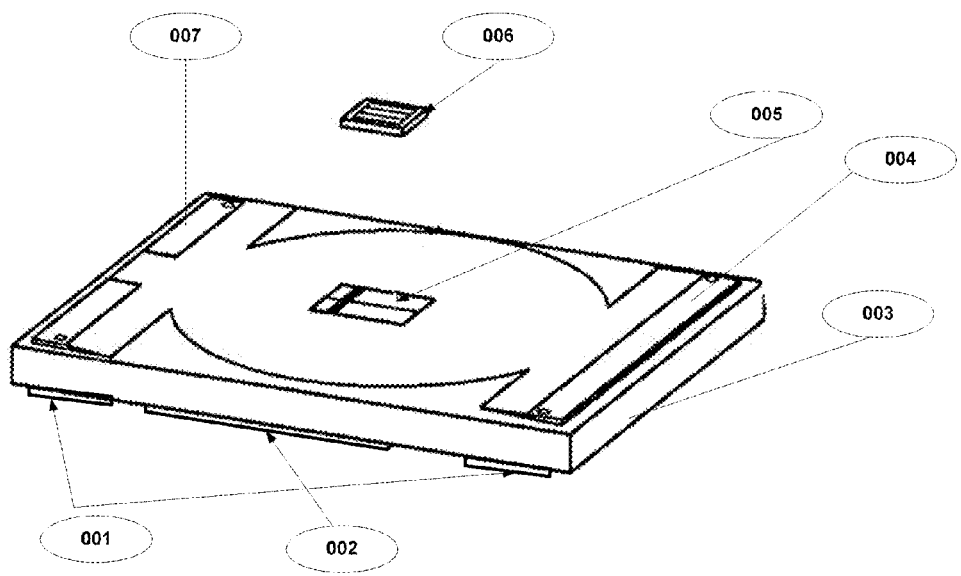
Figure 1 Prior art
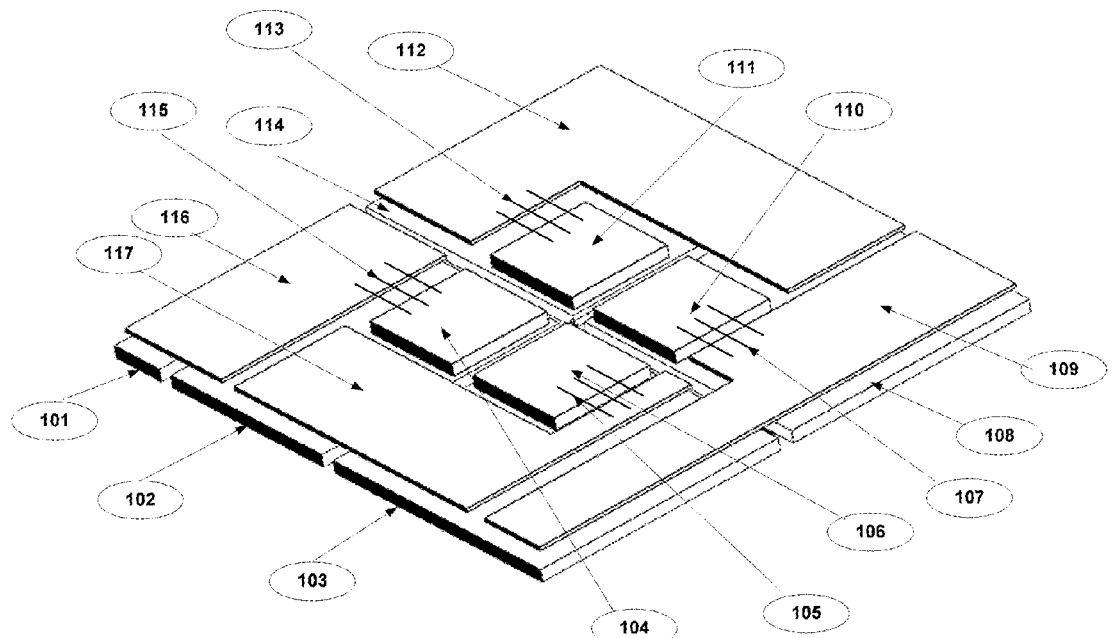
Figure 2 Electric connection

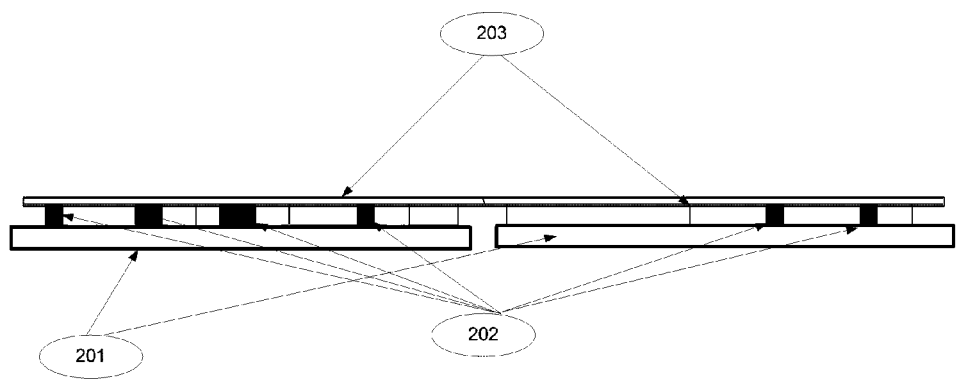
Figure 3 interconnect
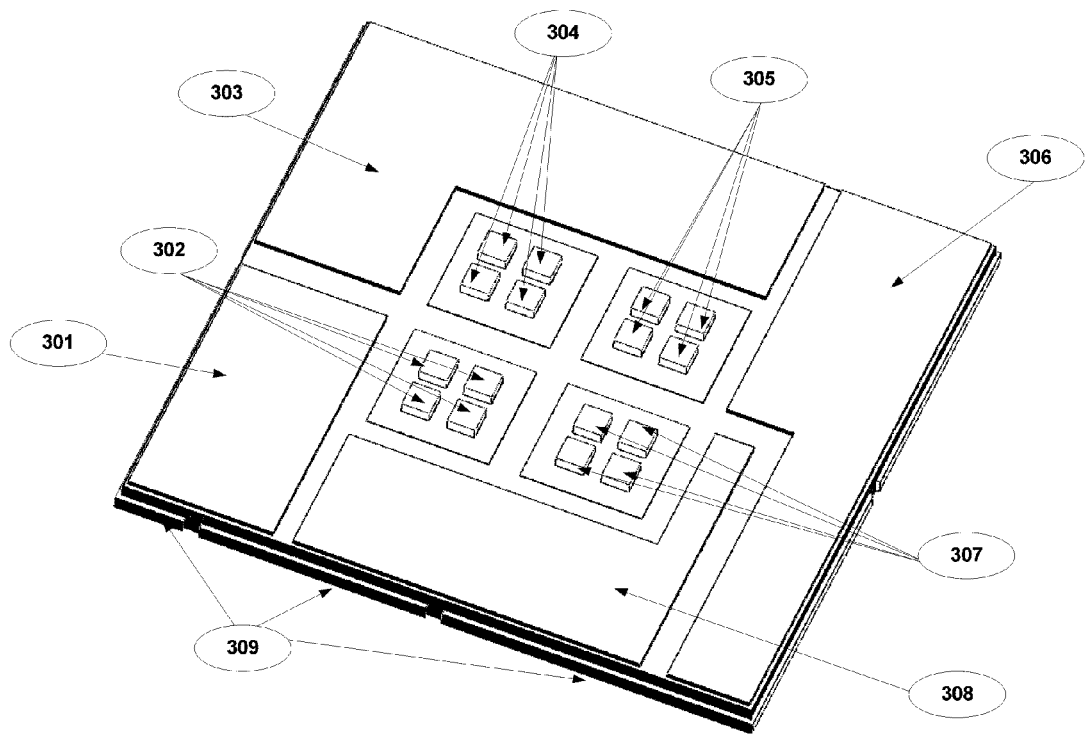
Figure 4 (multi-die group version)

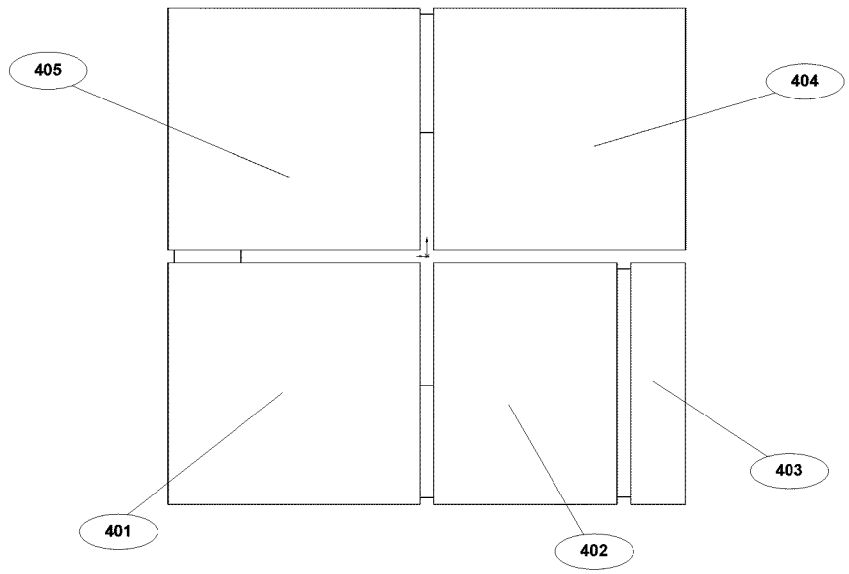
Figure 5 (back side of a package with dies in serial)
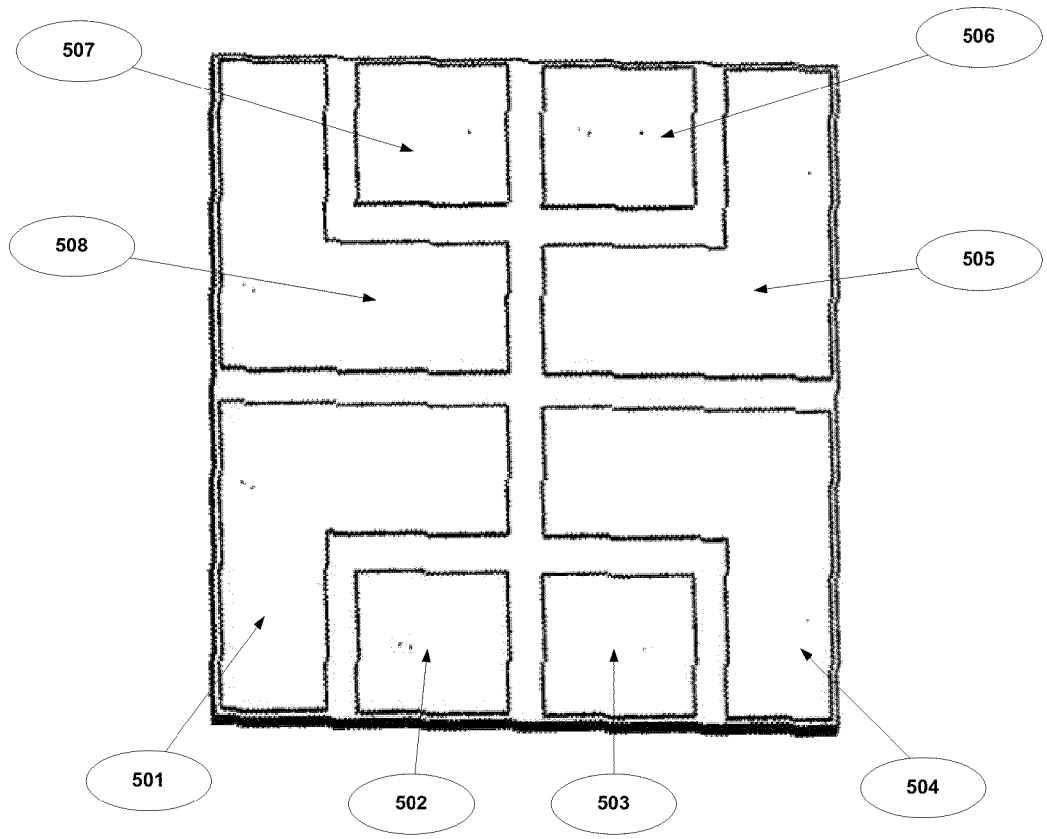
Figure 6 (back side of an isolated package)

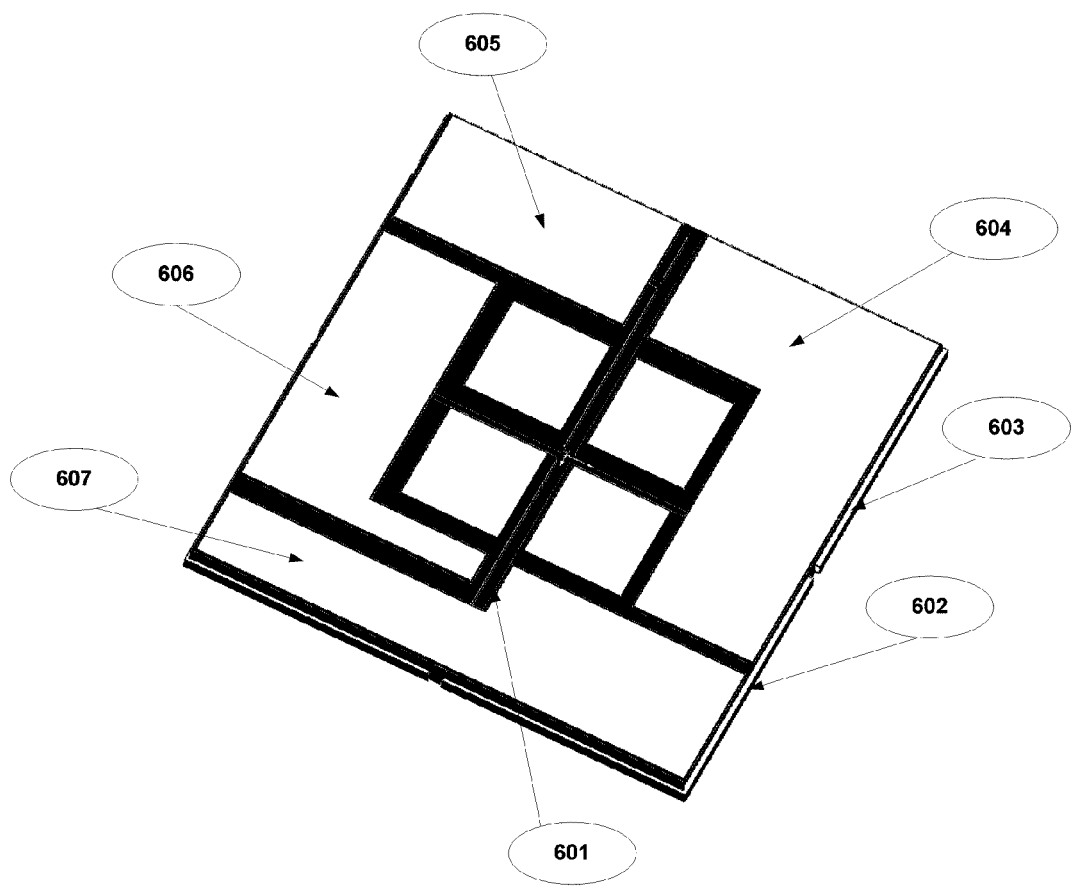
Figure 7 (whole package)

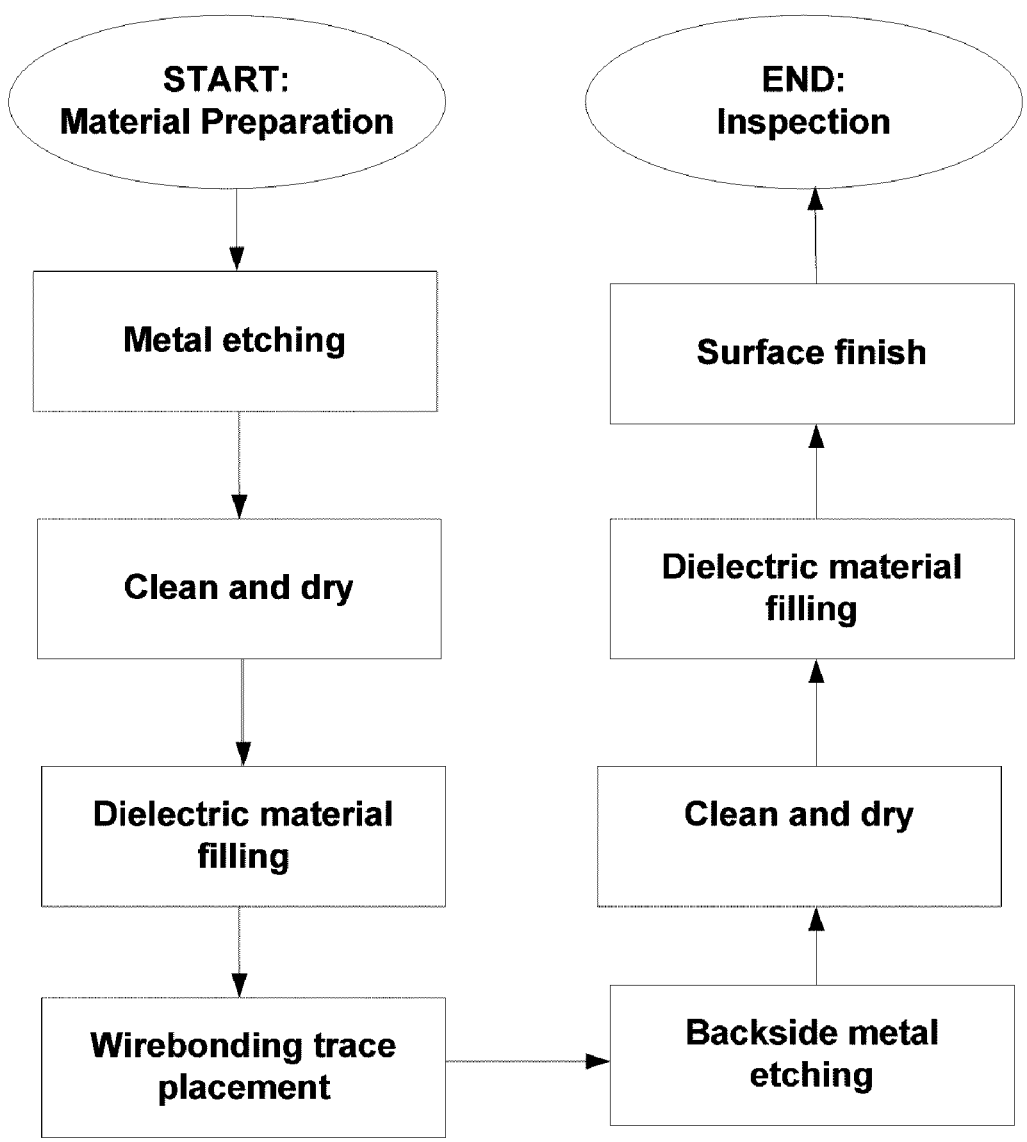
Figure 8 Major fabrication processes

METAL CORE MULTI-LED SMD PACKAGE AND METHOD OF PRODUCING THE SAME

FIELD OF THE INVENTION

This invention relates generally to structures and methods for semiconductor packaging, including single-LED Chip packaging and multi-LED Chip packaging. In particular, this invention relates to a package with metal core substrate to enhance high heat power LED cooling at the LED chip packaging level.

BACKGROUND OF THE INVENTION

LED (light emitting diode), is a semiconductor light emitting device, which can emitting light when current passes through. Generally, the LED chips need to be packaged to provide mechanical support, electrical connection, optical guidance, and heat flux path to outside. After that, the LED packages are integrated into systems as a function unit. An LED package generally includes a substrate member on which an LED or LED are mounted. The LED package may include a mounting pad attached to the substrate member with electrical connections being made to the LED for applying an electrical bias. LEDs generally comprise an active region of semiconductor material sandwiched between two oppositely doped layers. When a bias is applied across the doped layers, holes and electrons are injected into the active region where they recombine to generate light. The substrate member may also include traces or metal leads for connecting the package to external circuitry and the substrate may also act as a heat sink to conduct heat away from the LED during operation.

A SMD (surface mounted devices) LED package is one of the LED packages, which electrical connectors come from the underneath of the substrate (see FIG. 1). This type of package has advantages in compact design, low cost, high performance, and more flexible in system integration. The regular materials for the SMD substrate is ceramics, like Al2O3 (Alumina) or AlN. Alumina is chip but with poor thermal conductivity; AlN has good thermal conductivity but very expensive. Therefore, how to balance them is a question.

As the deep penetration of LED into the general lighting market, the higher lumen output is requirement to meet the specifications and compete with other light source, like fluorescence or Halide bulb. High lumen output means high power consumption, and same time, high heat dissipation. The heat dissipation of one SMD package can be as high as 50 to 100 Watts. To keep the LED dies under low temperature, the package thermal performance must be high. Sometimes, even the AlN cannot meet the requirement. Therefore, more advanced materials with higher thermal conductivity is preferred.

To increase light output, sometimes it is preferred to use multiple dies in serial or in parallel in a unit. That will increase the emitting area and therefore light output in a same footprint package.

SUMMARY OF THE INVENTION

Accordingly, it is the overall objective of the present invention to develop a new packaging method, which utilizes metal substrate, instead of ceramics substrate to take heat from the hot LED Chips, rapidly distribute to the lower surface in the SMD package, and thus upgrade the thermal performance of chip package and reduce the internal thermal resistance.

It is an object of the present invention to provide a new metal substrate concept, different from former ceramics substrate in packaging. This invention utilizes the combination of high thermal conductivity metal substrate inside and flexible electrical connection network to rapidly transport heat to the packaging lower surface.

An additional object of the present invention provides different SMD packaging structures in which the structure itself is a combination with different metal pieces and dielectric fill-in, which can effectively heat flux and also keep the package strong as regular.

Another object of the present invention is to provide metal blocks, which can easily handle multiple LED Chips in one package. This structure is able to handle any location distribution of the LED Chips and provide same high performance.

Another object of the present invention is to use new manufacture methods for the high cooling performance package. Different from regular ceramics based SMD packages, which general laser machining method is used, a chemical etching/plating method is used in the copper substrate SMD package. The benefit of the method is high quality, low cost, and capable with flex structure.

Still another object of the present invention is to provide a wide choice of the die arrangement in the package (show a four-die example in FIG. 2). It is possible to have more dies in serial as long as the package sizes can fit. That releases a constraint from manufacture method.

Still another object of the present invention is to provide another new configuration like can provide 2 or more sets of LED die arrangement, where each set of LED can operate separately, which can provide wide flexibility in one package.

Still another object of the present invention is to even provide flexible arrangement inside each unit (see FIG. 4 as an example). Each unit can have one or more LED dies, and also it is possible each die can have different seizes.

Lastly, it is an object of the present invention is to combine all of these unique design aspects and fabrication techniques into effective heat conducted metal substrate SMD package.

BRIEF DESCRIPTION OF THE DRAWING

Preferred embodiments of the subject matter described herein will now be explained with reference to the accompanying drawings of which:

FIG. 1 is a pictorial LED SMD package (prior art): anode/cathode (001), heat transfer pad (002), ceramics substrate (003), wire bonding pad (004 and 007), die placement pad (005), and LED die (105).

FIG. 2 illustrates the electrical connection of a metal substrate multi-LED SMD package: copper blocks (101,102, 103, 108,112,114,116 and 117), LED dies (106, 110, 111, 104), and wires (105, 107, 113, and 115).

FIG. 3 illustrates internal connection between the top metal traces and metal substrate, which may provide electrical connection among the dies: metal substrate (201), interconnection (202), and metal trace for wire bonding (202).

FIG. 4 is an example with many dies in a unit (four dies in one unit): die groups (302, 304, and 307), metal traces (301, 303, 306 and 308) and metal substrates (309).

FIG. 5 is backside pad of SMD package where dies are in serial: Anode (402), cathode (403), and metal substrate (401, 404, and 405).

FIG. 6 is backside pad of SMD package where dies are isolated: Anode and anode pairs (501/502, 503/504, 505/506, and 507/508).

FIG. 7 illustrates the whole SMD package before die assembly: dielectric filler (601), metal trace (604, 605, 606, and 607), and substrate (604, and 604).

FIG. 8 illustrates one typical fabrication process including chemical etching and plating process.

DETAILED DESCRIPTION OF THE INVENTION

The new metal substrate multi-LED SMD package and related methods are described herein with reference to FIG. 1~8, which illustrate different configurations and various embodiments. In this section, the detail information of each figure will be provided, and also, several typical examples will be specially described.

FIG. 1 shows a current typical LED SMD package structure. The substrate (003) is generally used with ceramics (Alumina or AlN are typical materials). In the center of the substrate, there is a place for LED die placement (005). On the two sides of the substrate top surface, metal traces (004 and 007) are wire bonding cathode pad and anode pad. Under the substrate, two pads (001 and 007) are cathode pad and anode pad, which will be connected to outside. Inside the substrate, metalized holes are drilled to keep the top trace pad and lower metal pads electrically connected. With this configuration, the substrate has to be dielectric material. To keep good thermal performance, ceramics materials are right candidates. However, the material of AlN is very expensive.

FIG. 2 is the new designed metal substrate multi-LED package. Four LED dies (104, 106, 110 and 111) are in this package. Metal traces (108, 112, 116, 117) are used to connect the LED die's cathodes, via wire bonding wires (105, 107, 113, and 115). Among five pieces of substrates (101, 102, 103, 108 and 114), the last four are directly connected with LED die's anodes. The 1$^{st}$ one, 101, is connected with trace 116 and acts as cathode to connect with outside. The detailed connections are 1) Die 104: anode side is connected with substrate (102), cathode side is connected with substrate 101, via wires 115, and trace 116 and copper interconnect (shown in FIG. 3); 2) Die 105: anode side is connected substrate 103, and cathode side is connected with trace 117, via wires 105; 3) Die 110, anode side is connected with substrate 108, and cathode side is connected with trace 109, via wires 107; 4) Die 111, anode side is connected with substrate 114, which will be used as package anode to connect outside, and cathode side is connected with trace 112, via wires 113.

The connection between dies is setup as: Die 104 and 105, from 104's anode 102 and 105's cathode 117, via metal interconnect (shown in FIG. 3); Die 105 and Die 110, from 105's anode 103 and 110's cathode 107, via metal interconnect (show in FIG. 3); Die 110 and Die 111, from 110's anode 108 and 111's cathode 112. The anode of the whole package is substrate 114 and the cathode of the whole package is substrate 101. That forms a serial connection between die 104, 105, 110 and 111. However, if the package is set as isolated mode, i.e., no connection within the dies, there is no need for interconnects.

FIG. 3 shows interconnect between substrates and traces. Interconnects (202) are metal based cylinder, which has electrical connection with substrates (201) and traces (203).

FIG. 4 shows the case that multi-LED (302, 304, 305 and 307) replace the single die in FIG. 2. Inside the multi-LED like 302, they are connected in parallel, which generally increase emitting area with same configuration. Also, it provides flexibility that each die group can have different die arrangement.

FIG. 5 shows the backside of FIG. 2 when the dies are connected in serial. Generally, 403 is package cathode (same as 101 in FIG. 2); 404 is package anode (same as 114 in FIG. 2). The substrates 402, 401 and 405 are anodes of the other three dies (402=102, 401=103, 405=108).

FIG. 6 shows the backside pads when the dies are electrically isolated. In this figure, cathodes are 502, 503, 506 and 507; anodes are 501, 504, 505, and 508. Among those, 501 and 502 are for one die; 503 and 504 are for one die; 505 and 506 are for one die; 507 and 508 are for one die. As traces on the top surface are always used as cathodes, there need interconnects between these traces and the cathode pads under the package.

FIG. 7 shows a whole package filled with dielectric materials (601) among the clearance after etching. The filler can provide mechanical connection and support among different metal pieces (602~607). Ideally, the dielectric materials are preferred to have similar CTE (coefficient of thermal expansion) and strong elastic module.

FIG. 8 shows a typical fabrication process from start to end. Always, metal material preparation is the first step, and then the metal is etched, followed by designed pattern. After etching, the panel is cleaned and dry. Then, dielectric material is filled into the gap to form support and generate surface for trace placement. After filling, thin metal circuit trace is placed and also etched as designed pattern. After finish one side treatment, the backside metal etching starts, similar as the front side, it is followed by clean and dry, the dielectric material filling. After those processes, all the exposed surfaces need surface finish. The parts will be sent for inspection.

EXAMPLE 1

Typical example to emphasize is the four-die SMD package in serial (see FIGS. 2, 3 and 5 for electrical connection, interconnect, and backside configuration).

EXAMPLE 2

Another typical application is four-die SMD package electrical isolated (see FIGS. 2, 3 and 6 for electrical connection, interconnect, and backside configuration).

EXAMPLE 3

Another example is similar as example 1, except multi-die used to replace single die in example 1. This configuration will bring flexible and more optics output for the package.

EXAMPLE 4

Another example is similar as example 1, except multi-die used to replace single die in example 2. This configuration will bring flexible and more optics output for the package.

The invention claimed is:
1. A LED SMD package comprises,
two or more LED dies, each of which has an anode and a cathode;
at least two units, each of which includes at least one said LED die and has a unit anode and a unit cathode;
a plurality of metal substrates dielectrically separated from each other, each of which electrically connects with one of said unit anodes;
a plurality of metal traces dielectrically separated from each other, each of which electrically connects with one of said unit cathodes;
said metal traces being arranged above said substrates; and
a plurality of metal interconnectors being attached between and electrically connect said substrates and said metal traces in such a manner that said units are electrically connected in serial.

2. A LED SMD package as claimed in claim 1, wherein said metal substrate is made of copper, aluminum or metal alloy.

3. A LED SMD package as claimed in claim 2, wherein dielectric material having substantial similar CTE to said substrates and strong elastic module is used to provide electrical isolation, gap filler and mechanical support.

4. A LED SMD package comprises,
two or more LED dies, each of which has an anode and a cathode;
a plurality of metal substrates dielectrically separated from each other, each of which electrically connects with a anode;
a plurality of metal traces dielectrically separated from each other, each of which electrically connects with a cathode; and
said metal traces being arranged above said substrates and being dielectrically connected.

5. A LED SMD package as claimed in claim 4, wherein said metal substrate is made of copper, aluminum or metal alloy.

6. A LED SMD package as claims in claim 4, wherein dielectric material having substantial similar CTE to said substrates and strong elastic module is used to provide electrical isolation, gap filler and mechanical support.

* * * * *